United States Patent [19]

Black et al.

[11] Patent Number: 4,939,101

[45] Date of Patent: Jul. 3, 1990

[54] METHOD OF MAKING DIRECT BONDED WAFERS HAVING A VOID FREE INTERFACE

[75] Inventors: Robert D. Black, Clifton Park; Stephen D. Arthur, Scotia; Robert S. Gilmore, Burnt Hills; Homer H. Glascock, II, Scotia, all of N.Y.

[73] Assignee: General Electric Company, Schenectady, N.Y.

[21] Appl. No.: 240,332

[22] Filed: Sep. 6, 1988

[51] Int. Cl.$^5$ .......................................... H01L 21/324
[52] U.S. Cl. ............................. 437/62; 148/DIG. 12; 437/225; 228/231; 228/234
[58] Field of Search ................... 156/89, 87, 286, 382, 156/308.2, 312, 285; 228/231, 234, 243; 437/61, 62, 225, 974, 921; 148/DIG. 12, DIG. 135, DIG. 3; 264/65; 65/36, 41

[56] References Cited

U.S. PATENT DOCUMENTS

| 3,333,324 | 8/1967 | Roswell et al. ...................... 228/234 |
| 4,705,585 | 11/1987 | Kelley et al. ......................... 156/89 |
| 4,762,269 | 8/1988 | Gyarmati et al. ................. 156/89 X |
| 4,774,196 | 9/1988 | Blanchard ................. 148/DIG. 3 X |
| 4,818,323 | 4/1989 | Secco et al. .......................... 156/286 |
| 4,883,215 | 11/1989 | Goesele et al. ...................... 228/116 |

FOREIGN PATENT DOCUMENTS

| 0174010 | 3/1980 | European Pat. Off. ....... 148/DIG. 3 |
| 0077881 | 5/1983 | European Pat. Off. .............. 156/87 |

OTHER PUBLICATIONS

Lasky, J. B., "Wafer Bonding for Silicon on Insulator Technologies", Applied Physics Letters, 48(1), 1/6/86, pp. 78–80.
Black, Robert D. et al., "Silicon and Silicon Dioxide Thermal Bonding", Materials Resources Symposium Proc., vol. 107, 1988 Materials Research Society, pp. 495–500.
Black, Robert D. et al., "Silicon and Silicon Dioxide Thermal Bonding for Silicon-on-Insulator Applications", Journal of Applied Physics, 63(8), Apr. 15, 1988, pp. 2773–2777.
Lasky, J. B. et al., "Silicon-on-Insulator (SOI) by Bonding and Etch-Back", IEDM 85, pp. 684–687.
Shimbo, M. et al., "Silicon-to-Silicon Direct Bonding Method", Journal of Applied Physics, 60(8), Oct. 15, 1986, pp. 2987–2989.
Furukawa, K. et al., "Lattice Configuration and Electrical Properties at the Interface of Direct Bonded Silicon", Extended Abstracts on the 18th (1986 International) Conference on Solid State Devices and Materials, 1986, pp. 533–536.
Nakagawa, Akio et al., "1800V Bipolar-Mode MOSFETs: A First Application of Silicon Wafer Direct Bonding (SDB) Technique to a Power Device", IEDM 86, pp. 122–125.
Ohashi, H. et al., "Improved Dielectrically Isolated Device Integration by Silicon-Wafer Direct Bonding (SDB) Technique", IEDM 86, pp. 210–213.
Kimura, M., et al., "Epitaxial Film Transfer Technique for Producing Single Crystal Si Film on an Insulating Substrate", Applied Physics Letters, 43(3), Aug. 1, 1983, pp. 263–265.

Primary Examiner—Michael W. Ball
Assistant Examiner—Michele K. Yoder
Attorney, Agent, or Firm—Robert Ochis; James C. Davis, Jr.; Marvin Snyder

[57] ABSTRACT

Wafers which are direct bonded to each other in accordance with prior art processes suffer from voids at their bonded interface. Annealing such composite structures at high temperature and high pressure (for silicon wafers preferably about 1,100° C. and 15,000 psi) eliminates all voids which are not a result of the presence of a particle on one of the wafers at the time of mating.

23 Claims, 1 Drawing Sheet

METHOD OF MAKING DIRECT BONDED WAFERS HAVING A VOID FREE INTERFACE

BACKGROUND OF THE INVENTION

1. Field of the Invention

The present invention relates to the field of direct bonded wafers, and more particularly, to the field of direct bonded wafers useful in the semiconductor arts.

2. Prior Art

Semiconductor-on-insulator (SOI) devices are attractive because of the high isolation provided between adjacent devices by the insulating substrate. Such devices were suggested more than 20 years ago and silicon-on-sapphire technology in which single crystalline silicon was grown on single crystalline sapphire substrates provided some of the expected benefits. However, the single crystalline silicon grown on sapphire never achieved the high quality provided by wafers sliced from boules of single crystalline silicon grown from silicon melts. Partially as a consequence of that inferior quality of the single crystalline silicon, silicon-on-sapphire devices never lived up to early expectations.

Relatively thick semiconductor wafers having PN junctions disposed at great depth from the wafer surface are required in order to produce high voltage power devices capable of holding off voltages in excess of several thousand volts. Fabrication of devices of this type using conventional fabrication techniques are extremely time consuming because of the great depth to which junctions must be diffused.

Direct bonding of two silicon wafers to each other has been reported. However, those direct bonded wafers have had numerous voids of varying sizes distributed across their bonded interface. Such voids make the composite wafers unusable for SOI device fabrication because when one of the original wafers is thinned (after direct bonding) to the thickness desired for the active devices, the thinned wafer bubbles or bulges at the voids thereby increasing the volume of the void and creating a non-planar surface which is not acceptable for device fabrication. The presence of voids at the bonded interface also renders these prior art direct bonded wafers inappropriate for the fabrication of high voltage devices because the voids would interfere with current flow vertically through the composite wafer perpendicular to the bonded interface.

Consequently, a technique for direct bonding wafers in a void free manner is needed.

OBJECTS OF THE INVENTION

A primary object of the present invention is to provide a method of direct bonding wafers in a void free manner.

A further object is to provide a method of eliminating voids present at the interface between direct bonded wafers.

Another object is to provide direct bonded wafers having a void free bonded interface.

SUMMARY OF THE INVENTION

In accordance with the present invention, the foregoing objects are accomplished by cleaning the wafer surfaces to be bonded, placing the wafer surfaces to be bonded in contact, annealing the bonded wafers at an elevated temperature to seal the interface and then further annealing the wafers at an elevated temperature in the presence of a hydrostatic pressure in excess of 300 psi. In one embodiment, the hydrostatic pressure is about 15,000 psi. The high temperature/high pressure annealing eliminates voids at the bonded interface thereby leaving a void free bonded interface.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

It is known to direct bond two wafers such as two silicon semiconductor wafers to each other by direct bonding. In this context, a direct bond is a bond which does not involve a fluid (at the time of bonding) layer which can fill in gaps between the wafers which would otherwise result from unevenness of the bonded faces of the wafers. Direct bonded wafers include those that form a bond as soon as they are placed in direct contact, those joined by diffusion bonds which require time, temperature and possibly light pressure to form and anodic bonding, but are not limited thereto and include any bonded face having voids thereat. Prior art attempts to direct bond wafers, having a flatness of 5 microns or more, in this manner result in a bonded interface which, while of reasonable quality at some locations, is separated at other locations with the result that the wafer as a whole is not suitable for use in the fabrication of semiconductor devices. A wafer having a flatness of 5 microns has a polished surface whose surface is everywhere within ±5 microns of an imaginary planar surface disposed midway between the highest "peaks" and deepest "valleys" of the wafer's surface. A wafer having a flatness of more than 5 microns is one in which some peaks and some valleys are further than 5 microns from the imaginary planar surface.

During our work which resulted in the present invention, we determined that the prior art technique of mapping voids at the bonded interface of a direct bonded composite wafer by transmitting infrared radiation through the thickness of the wafer is unreliable and inconclusive because there are many voids which this technique fails to detect. An acoustic micrograph made with an acoustic microscope at 50 MHz is much more accurate and reveals all voids that are more than a micron or two across. Where both infrared and acoustic maps were made of the same wafer, the acoustic map revealed many voids, particularly relatively small ones (less than about 0.5 mm to 1 mm across) than the infrared map did. The infrared map did not reveal any voids which were absent from the acoustic map. After subsequent thinning of one of the wafers, any of the voids may result in bubbling. There is no bubbling in any void free locations. Consequently, IR determinations of void density and location cannot be relied on to determine whether a void-free bond has been created.

Figure 1:
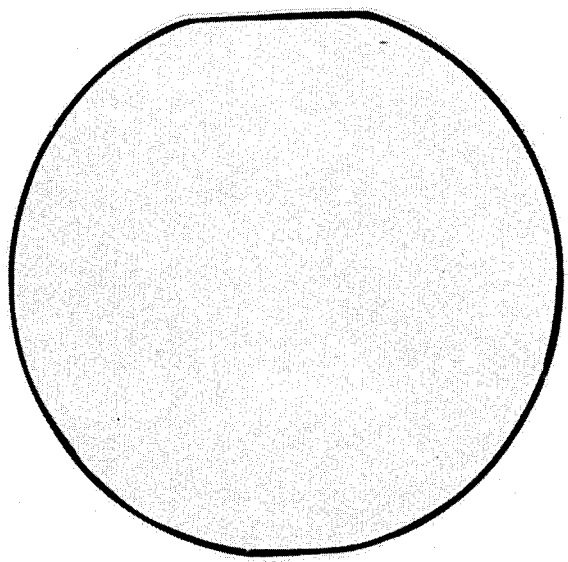
FIG. 1 is an acoustic micrograph of a pair of silicon wafers which have been direct bonded to each other and annealed at high temperature at atmospheric pressures.

FIG. 1 is an acoustic micrograph made at a frequency of 50 MHz of two direct bonded 4 inch silicon wafers (bonded silicon-to-silicon, no oxide layer) after they had been annealed at 1,100° C. for two hours. The dark areas are locations where there is a void between the wafers. The white areas are areas where the wafers are directly bonded. The non-bonded locations along the bonded interface where there are gaps between the wafers are called voids because of an absence of contact at that location. The name "voids" should not be taken as asserting anything with respect to the question of whether the "voids" are empty.

Figure 2:
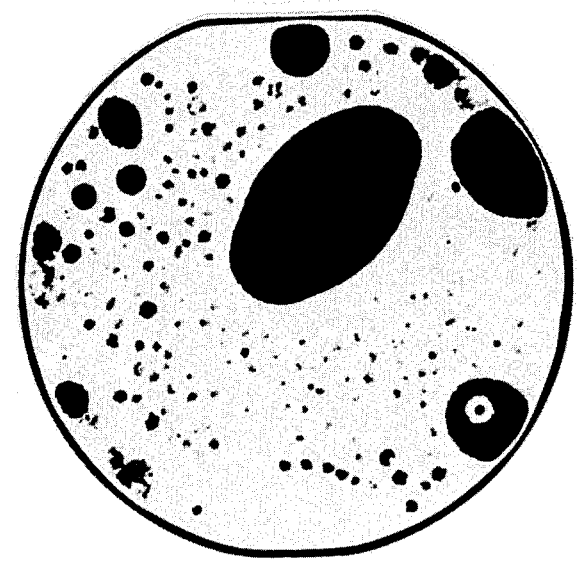
FIG. 2 is an ultrasonic micrograph of the same pair of silicon wafers after they were annealed at high temperature and high pressure.

In accordance with the present invention, such prior art direct bonded wafers which suffer from voids at various locations along their bonded interface are upgraded to wafers whose bonded interface is void free or voidless by annealing the wafers at high temperature and high pressure (a hyperbaric anneal). FIG. 2 is a second acoustic micrograph of the same pair of wafers as FIG. 1 after they had been annealed at 1,100° C. in argon at a pressure of 15,000 psi for 4 hours. The only remaining void is the ring around the perimeter of the wafers which is a result of the bevel present on all commercial wafers. For silicon wafers, an annealing temperature in the vicinity of 1,100° C. is preferred. This temperature is well below the melting points of silicon and silicon oxide. Some improvement in the voids is observed at annealing pressures as low as 300 pounds per square inch (psi) with the improvement increasing as the annealing pressure is increased thus annealing pressure of 1,000 psi or 10,000 psi are preferred. Improvement at pressures as low as 300 psi was primarily, if not exclusively, observed with wafers bonded in a vacuum such as less than $10^{-5}$ Torr. At annealing pressures of 15,000 psi, a void-free wafer results independent of whether the wafers were bonded in a vacuum, air, oxygen or nitrogen. The gas used to apply the annealing pressure is preferably argon or another inert gas in order to avoid causing reactions at the wafer surface. The applied pressure during hyperbaric annealing is sufficient to locally warp the two source wafers into contact at the "voids" and thus to pressurize any gases which are adsorbed or otherwise trapped within the void. This induces the formation of a silicon compound and the bonding of the two source wafers to each other. As a result, the voids do not reappear upon removal of the hyperbaric pressure.

This hyperbaric annealing technique may also be used as a step in the process of providing direct bonded wafers having a void-free interface. Where it is desired to bond two silicon wafers to each other with an insulating silicon dioxide layer between them to create a silicon-on-insulator (SOI) wafer, a thermal oxide is grown on one wafer in preparation for bonding. This thermal oxide is grown using well known processes. Then the wafers are cleaned in a "pirahna" solution of sulfuric acid at 130°-140° C. to which hydrogen peroxide is added. Following about five minutes immersion in this cleaning solution, the wafers are rinsed in deionized water and dried. The wafers are then mated. The mating of the wafers preferably takes place in pure, dry oxygen or in a vacuum. The wafers are mated by pressing the wafers together, polished-side-to-polished-side. The pressure may be applied manually or with quartz plates or by other techniques. These wafers, once pressed together, are bonded to each other and remain bonded even in a vacuum. This is thought to be a result of hydrogen bonding due to adsorbed hydroxyl groups on the surfaces of the wafers. Acoustic micrographs at this stage show a substantial void density, often including one or more voids which extend to the edges of the wafer. The wafers are then annealed in pure, dry oxygen at 1,100° C. for up to four hours in order to seal the bonding interface by closing any voids which extend to the wafer edges. This sealing step may be carried out of atmospheric pressure and is preferably carried out at a pressure of less than 30 psi. Lower annealing temperatures and lesser annealing times may be used if desired. A reduced void density results. The sealing is for the purpose of preventing the gas which provides the hydrostatic pressure in the next step from entering any of the voids along the edges of the bonding interface. Other means of sealing such as coating the edge of the mated wafer sandwich may be used if desired. Alternatively, the sealing step may be omitted where voids extending to the edge of the composite wafer are considered acceptable.

Once the bonding interface has been sealed, the annealing chamber is pressurized with an inert gas such as argon and the annealing is continued under the resulting hyperbaric conditions. One preferred set of hydrostatic annealing conditions is an argon pressure of 15,000 psi for four hours at 1,100° C. These conditions uniformly provide a void-free interface (in the absence of particles along the interface) as determined by a 50 MHz ultrasonic microscope as shown in FIG. 2. Lesser pressures are effective for producing a void-free interface when the wafers have been bonded in pure oxygen or a vacuum in the absence of nitrogen. The presence of nitrogen in the atmosphere at the time of mating the wafers requires a pressure on the order of 15,000 psi to obtain a void-free interface.

The difference in conditions required to produce a void-free interface with wafers mated in pure oxygen and wafers mated in the presence of nitrogen is believed to be a result of absorption of any gas present in the voids into the semiconductor structure by the formation of silicon dioxide in the former case and formation of silicon nitride or silicon oxy-nitride in the latter case. Oxygen can diffuse through silicon dioxide, thereby enabling all of the oxygen present in a void to be absorbed in this manner. In contrast, oxygen and nitrogen do not diffuse readily through silicon nitride. It is therefore felt that the higher pressure is needed when nitrogen is present in order to induce sufficient diffusion of oxygen and nitrogen into the silicon nitride which forms on the surface of the void in order to close the void completely.

The same process which has just been described may be used to bond two wafers, each having a thermal silicon oxide layer on their bonding face. The only significant difference between such a composite formed between two oxidized wafers and between one oxidized wafer and one unoxidized (bare) wafer is the time required to achieve a void free interface. The time for obtaining a void-free interface is greater with two oxidized wafers than it is with one oxidized wafer and one unoxidized wafer. This difference in time is believed to be a result of increased time for the oxygen contained within a void to diffuse through the oxide layer to the elemental silicon where it can form of silicon oxide. That is, in the situation where one of the wafers is bare silicon, there is elemental silicon exposed adjacent to the void with which oxygen or other gasses contained in the void can react. In contrast, in the two-oxidized-wafers situation, any such gasses must diffuse through one of the silicon oxide layers in order to reach elemental silicon where they can react to form a compound at the annealing temperature.

One use of a composite in accordance with the present invention is to provide a relatively thin, high quality single crystalline silicon layer on an insulating substrate for SOI use. Such a structure is obtained in accordance with the present invention by selecting a heavily doped N type (N+) wafer as a temporary substrate and then growing a lightly doped epitaxial (epi) layer thereon. This epi layer may be either N type or P type. The exposed surface of the epitaxial layer is used as the bonding face of that wafer. A second wafer is selected which will comprise the permanent substrate of the SOI composite. The permanent substrate wafer and the epitaxial surface of the first wafer (with one having a thermal oxide layer thereon) are then direct bonded in accordance with the present invention to form a composite wafer having a void free interface. After the composite silicon, oxide, silicon wafer has been formed, the N+ temporary substrate is lapped or ground mechanically to a 1 to 2 mil thickness. The temporary substrate, after lapping, is preferably as thin as it can be made in a controllable manner without impairing the quality of the epitaxial layer. Thereafter, the composite wafer is etched in a selective etch consisting of 3:1:8 of $HNO_3$:Hf:acetic acid. The etch bath is stirred by a magnetic stirring rod and the composite wafer (temporary substrate side down) is placed horizontally in the etch and rotated to ensure uniform etching. The potential of the etchant bath is monitored by forming a galvanic cell with the acid serving as the electrolyte and a carbon rod and a platinum rod serving as the electrodes. If the potential changes during the time of etching, small amounts of hydrogen peroxide are added to stabilize the etchant by converting any nitrous acid reaction product into nitric acid. The etch stops abruptly at the epitaxial interface. The abrupt self-quenching of the etching at the epitaxial interface assures that the epitaxial layer which forms the "active" silicon layer of the SOI wafer is of high quality single crystalline material, has a uniform thickness and is free of any localized remnants of the substrate material. Unfortunately, the selective etch also acts as a defect etchant for the epi layer and therefore, the freshly etched surface is not really of commercial quality or acceptable for fine-line photolithographic work. Consequently, a final mechanical polishing step is used to bring this surface up to commercial quality. The resulting composite wafer can be processed in the normal fashion for wafers of that semiconductor material. The present need for mechanical polishing of the exposed epitaxial surface of the composite wafer should be taken into account in determining the thickness to which the epitaxial layer should be grown.

With the void-free or voidless interface between the epitaxial layer and the permanent substrate, subsequent processing of the wafer to create devices and circuits in the epitaxial layer is performed in the same manner as with the other wafers. The processing has no adverse effect on the integrity of the composite wafer.

In contrast, with prior art direct bonded wafers, the voids which are present at the bonded interface result in "bubbling" of the epitaxial layer at the locations of voids. This results in a non-planar surface which hinders photolithographic processing and results in ineffective or inoperative devices at void locations.

Photomicrographs which are contained in papers based on our work entitled "Silicon and Silicon Dioxide Thermal Bonding" by Robert D. Black et al., Material Research Society Symposium Proceedings, Vol. 107, 1988, pages 495–500 and "Silicon and Silicon Dioxide Thermal Bonding for Silicon-on-Insulator Applications" by R.D. Black et al., Journal of Applied Physics, Vol. 63, No. 8, Apr. 15, 1988, pages 2773–2777, both articles being incorporated herein by reference, demonstrate that the interface between the silicon and the thermal oxide is essentially indistinguishable from the interface between the silicon and the bonded oxide. Where two oxidized wafers are bonded to each other, the position of the bonded interface between the $SiO_2$ layers is not detectable in transmission electron micrographs. Where two silicon wafers are directly bonded silicon-to-silicon, the detectability of the bonded interface depends on the relative crystallographic orientation of the two wafers.

While the above process has been described in terms of bonding a bare silicon wafer to an oxidized silicon wafer, the process may be used to bond two bare silicon wafers to each other. Such bonding is referred to as silicon-to-silicon bonding and the resulting composite wafer is referred to as an STS wafer. The process is the same as described above with the omission of the step of forming the oxide layer on one of the wafers. Similar results are obtained.

A deep PN junction can be provided in the STS wafer by selecting as source wafers two wafers having the same crystallographic orientation and opposite conductivity types of the desired doping concentrations. Although use of identical crystallographic orientations is preferred in order to minimize dislocation density, differing orientations may be used and can be bonded successfully. However, dislocation densities are increased because of differing lattice parameters of the different wafers along a straight line. For PN junction use, it may be desirable to avoid the depletion region of the junction extending to the bonded interface. This can be accomplished by epitaxial growth or diffusion formation of a relatively thin layer on one of the wafers prior to bonding to displace the PN junction from the actual bonded interface. In STS wafers, the number of crystallographic dislocations at the bonded interface is determined by the accuracy with which the crystallographic axes of the starting wafers are aligned prior to mating the wafers.

While hyperbaric pressures are required to achieve a void free interface in the direct bonding of the source wafers, lesser pressures may provide the same results in SOI (or other) composites which have not been hyperbaric annealed and in which bubbles develop during thinning of the active device wafer or prior to thinning to the point where bubbles develop. At that time, the thinned wafer is not as stiff as when originally bonded and therefore, annealing at that stage may eliminate voids with more moderate pressures, possibly even including atmospheric pressure.

While silicon-to-silicon or silicon-to-silicon-oxide bonds have been emphasized, silicon-to-silicon-nitride and silicon-nitride-to-silicon-nitride bonds may also be formed. However, as has been discussed, the presence of the silicon nitride layer may slow the annealing or void-collapsing process because of slower diffusion or lower bond formation processes.

While the specific examples employ silicon wafers, the same process of high pressure annealing will induce void elimination or collapse at the bonded interface between other direct bondable wafers. The process is most successful where any gasses which may be entrapped within a void can be absorbed into one of the constituent wafers by the formation of a compound at high temperature. However, this is not essential if the wafer faces can be made free of adsorbed gasses prior to mating the wafers. One technique for removing adsorbed gasses prior to mating the wafers is to sputter etch the wafers in a vacuum prior to mating them and to then mate them without breaking the vacuum. Other techniques may also be used.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of thermally bonding a bonding surface of a first semiconductor wafer to a bonding surface of a second semiconductor wafer, said method comprising:
   cleaning said bonding surfaces;
   placing said bonding surfaces in contact to form a direct bond between said wafers;
   annealing said direct bond at an elevated temperature under a hydrostatic pressure of at least 300 psi under conditions in which the interface between said bonding surfaces is at all times free of fluids.

2. The method recited in claim 1 wherein said hydrostatic pressure is at least 1,000 psi.

3. The method recited in claim 1 wherein said hydrostatic pressure is at least 10,000 psi.

4. The method recited in claim 1 wherein said hydrostatic pressure is about 15,000 psi.

5. The method recited in claim 1 wherein said bonding face of said first semiconductor wafer is silicon; and
   said bonding face of said second semiconductor wafer is silicon.

6. The method recited in claim 1 wherein:
   said bonding surface of said first semiconductor wafer is silicon; and
   said bonding face of said second semiconductor wafer is silicon oxide.

7. The method recited in claim 1 wherein:
   said bonding face of said first semiconductor wafer is silicon oxide; and
   said bonding face of said second semiconductor wafer is silicon oxide.

8. The method recited in claim 1 wherein the step of placing said bonding surfaces in contact is carried out in a vacuum at a pressure of less than $10^{-5}$ Torr.

9. The method recited in claim 1 wherein the step of placing the bonding surfaces in contact is carried out in the absence of nitrogen.

10. The method recited in claim 1 wherein the step of placing said bonding surfaces in contact is carried out in an atmosphere of pure oxygen.

11. The method recited in claim 1 further comprising the step of:
    pre-annealing said bond at an elevated temperature at a hydrostatic pressure of less than 30 psi.

12. A method of eliminating voids between direct bonded wafers comprising the steps of:
    providing said direct bonded wafers; and
    annealing said wafers at a hydrostatic pressure of at least 300 psi.

13. The method recited in claim 12 wherein said annealing step is carried out at an elevated temperature.

14. The method recited in claim 13 wherein said hydrostatic pressure is at least 1,000 psi.

15. The method recited in claim 13 wherein said hydrostatic pressure is at least 10,000 psi.

16. The method recited in claim 13 wherein said hydrostatic pressure is about 15,000 psi.

17. A method of collapsing a void disposed along the bonded interface between two direct bonded wafers comprising the step of:
    annealing said direct bond at an elevated temperature under a hydrostatic pressure of at least 300 psi.

18. The method recited in claim 1 wherein:
    said elevated temperature is in the vicinity of 1,100° C.

19. The method recited in claim 4 wherein:
    said elevated temperature is in the vicinity of 1,100° C.

20. The method recited in claim 13 wherein:
    said elevated temperature is in the vicinity of 1,100° C.

21. The method recited in claim 16 wherein:
    said elevated temperature is in the vicinity of 1,100° C.

22. The method recited in claim 11 wherein:
    said pre-annealing step seals the edges of the bonding area of the wafer to isolate voids at the bonding interface from the ambient atmosphere.

23. The method recited in claim 1 wherein said first and second semiconductor wafers are both single crystalline.

* * * * *